United States Patent [19]

Dougherty, Jr.

[11] 3,739,469

[45] June 19, 1973

[54] MULTILAYER PRINTED CIRCUIT BOARD AND METHOD OF MANUFACTURE

[75] Inventor: William Edwin Dougherty, Jr., Fishkill, N.Y.

[73] Assignee: International Business Machines Corporation, Armonk, N.Y.

[22] Filed: Dec. 27, 1971

[21] Appl. No.: 212,293

[52] U.S. Cl. ........... 29/625, 174/68.5, 317/101 CM

[51] Int. Cl. .............................................. H05k 3/16

[58] Field of Search ............... 174/68.5; 317/101 B, 317/101 C, 101 CC, 101 CM, 101 CE; 339/17 R, 17 C, 18 B; 29/624–626, 628

[56] References Cited

UNITED STATES PATENTS

| | | | |
|---|---|---|---|
| 3,322,881 | 5/1967 | Schneble, Jr. et al. | 174/68.5 |
| 3,334,395 | 8/1967 | Cook et al. | 174/68.5 X |

FOREIGN PATENTS OR APPLICATIONS

| | | | |
|---|---|---|---|
| 1,105,068 | 3/1968 | Great Britain | 174/68.5 |

*Primary Examiner*—Darrell L. Clay
*Attorney*—W. N. Barret, Jr., J. Jancin, Jr. and E. S. Gershuny et al.

[57] ABSTRACT

A multilayer printed circuit board wherein via holes, which extend from one surface to the other of one layer of the board, are arranged to be concentric with through holes, which extend from the top surface of one layer to the bottom surface of another layer. The via holes are equal in size to the clearance space which would normally surround a through hole. In the manufacturing process, the large via holes are made for individual layers of the printed circuit board. During lamination, prepreg will be extruded into the via holes. After lamination, the through holes will be drilled through the center of the via holes. The prepreg which had been extruded into the via holes will insulate them from the concentric through holes.

4 Claims, 3 Drawing Figures

MULTILAYER PRINTED CIRCUIT BOARD AND METHOD OF MANUFACTURE

This invention relates to improvements in multilayered printed circuit boards and their method of manufacture. More particularly, the invention relates to the manner in which via holes and through holes are placed within the printed circuit board.

DEFINITIONS

Although the terms "via hole" and "through hole" are often used interchangeably by those skilled in the art, the two terms have different meanings within the context of the following specification and claims.

A "through hole" is herein defined as a hole which passes through more than one layer of a multilayer printed circuit card. The through hole will be plated with a conductive material in order to achieve electrical contact between non-adjacent surfaces. If desired, electrical contact may also be achieved between those surfaces and one or more intermediate surfaces. Most generally, the through hole will go through all layers of the multilayer circuit board.

A "via hole" is herein defined as a hole through one or more, but not all, of the circuit board layers which contain a through hole. A via hole will be plated to achieve electrical contact between two surfaces within the printed circuit board. Generally, the two surfaces for which electrical contact is achieved will be the opposite surfaces of one layer of the printed circuit board.

BACKGROUND OF THE INVENTION

Multilayered printed circuit boards, and various methods for their manufacture, are well known in the electronics industry. Typically, each layer of the printed circuit board consists of epoxy dielectric material with metal foil (such as copper) on its upper and lower surfaces. A process including the steps of printing and etching may be used to produce a configuration of printed circuit wiring on each side of the layer. Alternatively, a masking and plating process can be used to deposit the printed circuit wiring on the dielectric. After each layer is made, via holes may be made and plated. The various layers are then bonded together to form a multilayered printed circuit card by first coating each layer with a prepreg (usually a B stage epoxy), aligning and stacking the layers, and subjecting the stack of layers to conditions of temperature and pressure which result in the formation of a permanent bond between the prepreg and the various layers. After this lamination process, through holes may be made and subsequently plated.

When making the through holes, a significant amount of care must be taken to ensure that no undesired electrical contact is made between the plated through hole and intermediate surfaces within the multilayered printed circuit board. Avoidance of such undesired electrical contact (or short circuits) is commonly achieved in the prior art by defining, for each layer that is not to contact the plated through hole, a "clearance area" within which no electrically conductive material is permitted. This clearance area is usually a circle having a diameter roughly twice that of the through hole. Because of this clearance area, the presence of each through hole traversing but not contacting a layer causes that layer to lose an otherwise usable amount of area that is four times the area of the through hole. This loss of usable area is one factor which tends to limit the amount of circuitry which can be incorporated into a circuit board of a given size.

SUMMARY OF THE INVENTION

The above and other disadvantages of the prior art are overcome, in accordance with one aspect of this invention, in a multilayer printed circuit board wherein via holes are arranged concentrically about through holes. During the manufacturing process, via holes are located in the various layers so that their centers will be at the same point as the center of a through hole. The via holes so located are made as large as the area that would have been allowed as the clearance area around the through hole. When the several layers are subsequently laminated to form a multilayer printed circuit card, prepreg will be extruded into the large via holes. After the prepreg has hardened, standard techniques will be used to make the through holes. Those via holes which surround a through hole will be insulated therefrom by the dielectric prepreg which had been extruded into the via hole. Electrical contact between the through hole and any of the intermediate layers which do not contain concentric via holes can be achieved in a standard manner.

The most significant advantage of this invention is that it reduces the amount of wasted space within the printed circuit board. Although the via holes described herein are larger than those commonly used in the prior art, they are almost entirely within an area that previously was unusable. This facilitates achievement of the objective of the densest possible packaging of circuits within the board.

Another advantage of this invention results from the fact that it facilitates the use of large via holes. When using a large via hole, it becomes a simple matter to introduce discontinuities into the plating of the hole and to use the discontinuous plated sections to achieve several distinct via circuit connections.

The foregoing and other features and advantages of the present invention will be apparent from the following description of preferred embodiments of the invention as illustrated in the accompanying drawings.

DETAILED DESCRIPTION

Figure 1:
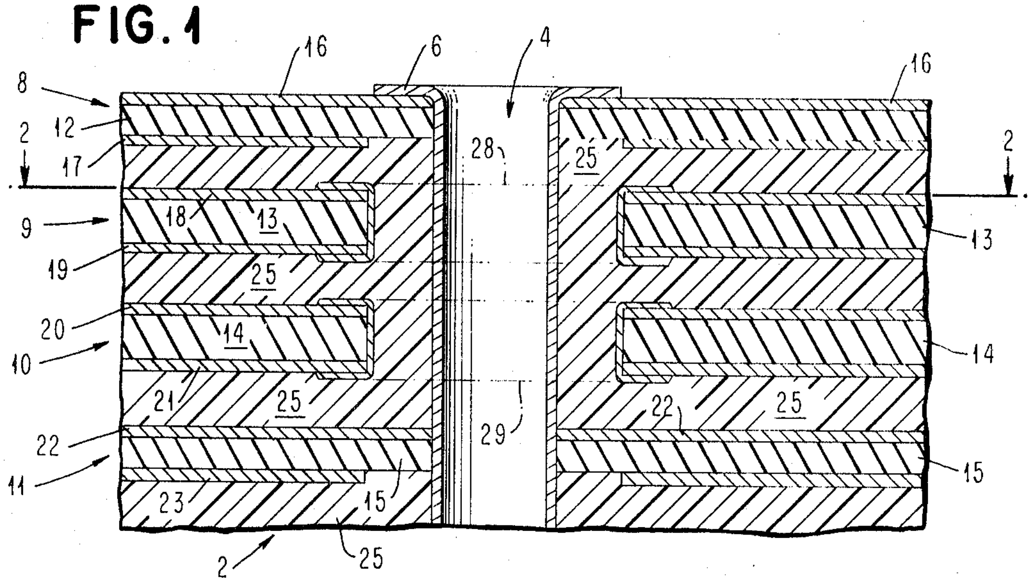
FIG. 1 is a cross-sectional view of a portion of a multilayer printed circuit board manufactured in accordance with the invention.

When manufacturing a multilayer printed circuit board in accordance with this invention, each layer of the board is manufactured, for the most part, in accordance with known techniques. So far as a single layer of the board is concerned, the most significant difference between this invention and the prior art is that the printed circuit pattern for the layer is laid out in such a manner that via holes are located so that their centers occur at the same points as the centers of through holes which will be subsequently made, and that the via holes that are so located have a radius that is as large as the sum of the radius of the clearance area which would normally surround a through hole and the thickness of the plating which will be placed in the via hole. After the various layers of the printed circuit board have been constructed, they are coated with prepreg, stacked, and aligned as in the prior art. Then, again as is done in the prior art, the stack of layers is subjected to appropriate conditions of heat and pressure to cause permanent lamination. In accordance with the preferred embodiment of this invention, the heat and pressure used in the lamination process will cause the prepreg that is between the layers to be extruded into and fill the large via holes. After the multilayered board has cured, through holes are made and plated using appropriate prior art techniques. The plated through holes which pass through plated via holes will be insulated therefrom by the prepreg which was extruded into the via holes.

In the preferred embodiment of the invention, advantage is taken of the relatively large size of the via holes by, whenever practical, using the large via hole to create two or more independent via connections (hereinafter called a "split-via"). One technique for making a split-via is shown in the IBM Technical Disclosure Bulletin, Vol. 10, No. 12, May 1968 in an article F. M. Reinhart entitled "Making Interconnections in Multilayer Boards" at pages 1985 and 1986. Those skilled in the art will recognize that the through holes could also, if desired, be made in a similar manner as split-through holes providing two or more independent connections in the same plated hole.

Although it is preferred that the large via holes be filled during the laminating process by the extrusion of prepreg into the via holes, it will be recognized by those skilled in the art that the via holes may be filled with an insulating material by various other well known techniques. For example, the via holes could be filled before the laminating process. One technique that could be used for filling the via holes is described by S. S. Mendola "Filling Holes in Printed Circuit Boards"IBM Technical Disclosure Bulletin, Vol. 12, No. 4, September 1969, page 512.

All of the materials and the various parameters (e.g., temperature, pressure, time, etc.) that are required in order to practice this invention are well known to those skilled in the art and require no detailed description herein. However, some preferences are as follows: a preferred prepreg is comprised of Fiberglass impregnated with B stage epoxy; the lamintaing process preferably utilizes a temperature of 350°F and a pressure of 330psi for 1 hour; and the laminated multilayer printed circuit board is cured at a temperature of 200°F for a period of one hour before the through holes are made.

FIG. 1 is a cross-sectional view of parts of a multilayered printed circuit card made in accordance with this invention. The card 2 contains a through hole 4 which has been plated with a conductive material 6 in order to achieve electrical contact between its upper and lower surfaces. FIG. 1 shows four of the layers 8, 9, 10, 11 of the board. Each layer comprises an insulator 12, 13, 14, 15 with its top and bottom surfaces holding the conductive printed circuit patterns 16 and 17, 18 and 19, 20 and 21, 22 and 23, respectively. (For simplicity in representation, the printed circuit patterns 16–23 appear in the drawings as if they were solid layers. Of course, those skilled in the art will recognize that each of the printed circuit patterns 16–23 is not solid but contains the pattern of printed circuit wiring. Another detail of printed circuit cards that is not shown in FIG. 1 is the presence of voltage planes for carrying ground levels and reference potentials. The inclusion, as necessary, of such planes is well known to those skilled in the art and, for purposes of clarity, is not described herein.) The space between layers of the board is filled by prepreg 25. The prepreg 25 also fills the space between the plating 26, 27 of via holes 28, 29 and the plating 6 of through hole 4 to insulate the two plated holes from each other. In the embodiment shown in FIG. 1, conductors 16 and 22 are shown as contacting the plating 6 of the through hole 4. Conductors 17 and 23 are shown as not contacting the plating 6 and are separated therefrom by a normal clearance area. In a preferred embodiment of the invention, the through hole 4 is 0.017 inches in diameter and the via holes 28, 29 (as well as any clearance area required on conductors such as 17, 23) can range from approximately 0.035 inches to approximately 0.040 inches.

In manufacturing the circuit card shown in FIG. 1, each of the layers 8–11 is generally made separately. Via holes 28, 29 are made in layers 9, 10 and the respective via holes are plated 26, 27. After manufacture of the several layers, each layer is coated with prepreg, they are aligned and stacked, and the stack is subjected to appropriate temperature and pressure to cause lamination. During the lamination process, the prepreg is extruded into via holes 28, 29. After the stack has cured, through hole 4 is made and plating 6 is applied.

Figures 2, 3:
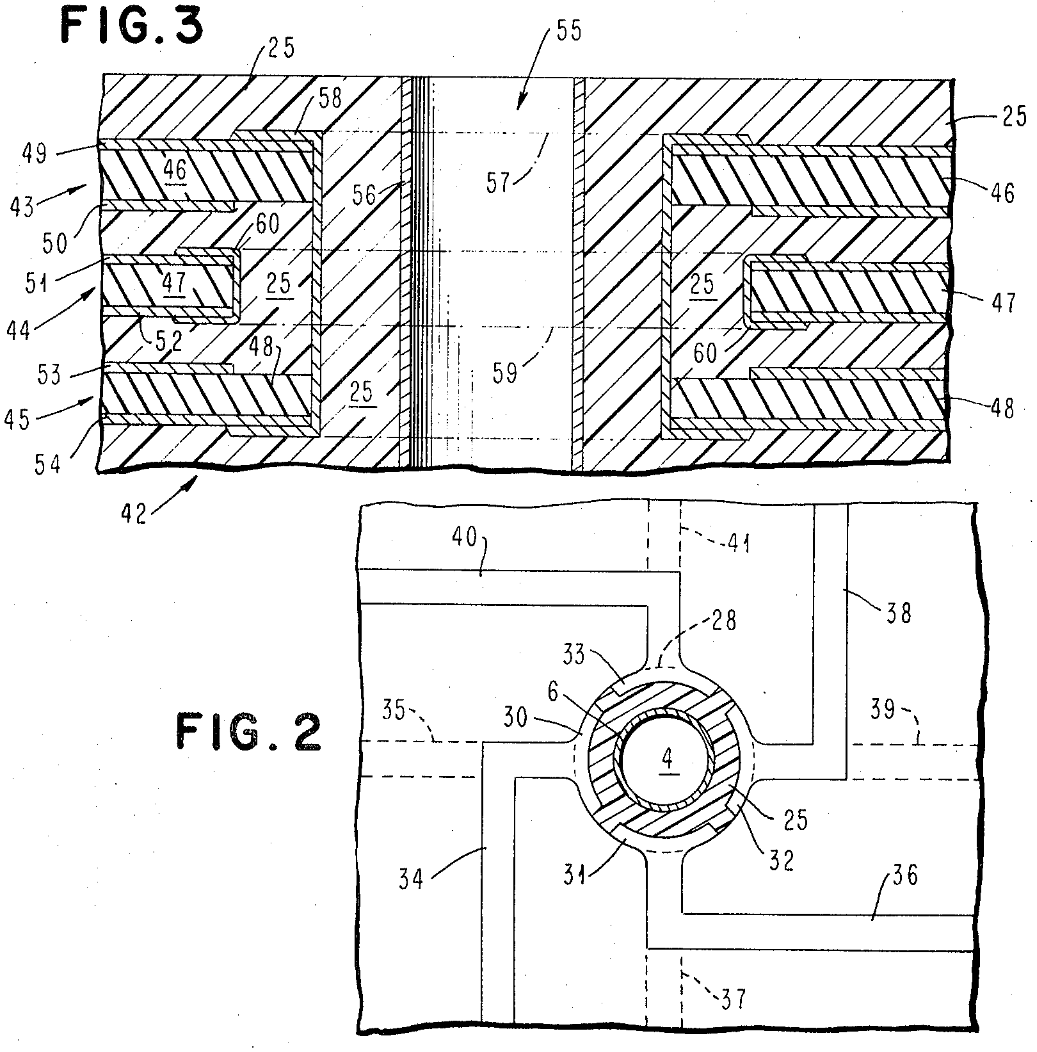
FIG. 2 is a view of one of the layers of the board taken along the line 2—2 of FIG. 1.
FIG. 3 is a cross-sectional view of a multilayer printed circuit board illustrating an alternative embodiment of the invention.

FIG. 2 is a view taken along the line 2—2 of FIG. 1 to show additional details of one of the layers in the circuit board. Broken line 28 shows the periphery of the via hole that was placed in the layer. Areas 30, 31, 32, 33 are the plated sections that serve as four separate via connections. The plating 6 of through hole 4 is insulated from the via connections 30–33 by prepreg 25 which was extruded into the large via hole during the laminating process. Plated area 30 connects a printed circuit lead 34 appearing on the top surface of the layer to a printed circuit lead 35 appearing on the bottom surface of the layer; plated areas 31, 32, 33 connect printed circuit leads 36, 38, 40 appearing on the upper surface of the layer to printed circuit leads 37, 39, 41, respectively, appearing on the bottom surface of the layer.

FIG. 3 is a cross-sectional view of part of a multilayered printed circuit board 42 showing features of another embodiment of the invention. Three layers 43, 44, 45 are shown, each comprising a dielectric 46, 47, 48 with printed circuitry 49 and 50, 51 and 52, 53 and 54 on it upper and lower surfaces. Going through this entire portion of the board is a through hole 55 and its plating 56. Surrounding through hole 55 is a via hole 57 that goes through all three layers 43, 44, 45. The upper surface 49 of layer 43 is electrically connected to the lower surface 54 of layer 45 by plating 58. Although hole 57 goes through more than one layer of the multilayer printed circuit board, it may be considered as being a via hole with respect to through hole 55 as that term has been defined herein. As was described above, hole 57 has been made large enough to ensure proper clearance between the plating 58 and the plating 56. The platings 58, 56 are insulated from each other by prepreg 25. Layer 44 has within it a via hole 59 through which its upper and lower surfaces 51, 52 are connected by plating 60. Via hole 59 is made as large as the clearance area which would otherwise have had to surround hole 57.

The circuit board shown in FIG. 3 would generally be manufactured in the following manner. Layers 43, 44 and 45 would be produced independently of each other. A relatively large hole 59 would be place in layer 44 and plating 60 applied to electrically connect surfaces 51 and 52. Layers 43, 44 and 45 would then be coated with prepreg and laminated in a standard manner. During the lamination process, prepreg would be extruded into hole 59. After this three-layer stack had cured, hole 57 would be made and plating 58 added to establish electrical contact between surfaces 49 and 54. The three layers 43, 44, 45 could then be coated, on the top and bottom surfaces, with prepreg and aligned and stacked with other layers of the board for a second lamination. During the second lamination process, prepreg would be extruded into hole 57. After the entire stack had cured, through hole 55 would be made and plating 56 applied.

During the manufacture of a circuit card such as that shown in FIG. 3, one of the intermediate laminated sets of layers might have a via hole such as 57 that is deep enough so that extrusion of prepreg into the hole during further lamination would not be a reliable way of filling the hole with insulating material. In that case, it would be desirable to fill the hole 57 with an appropriate insulating material (such as prepreg) before laminating additional layers onto the stack.

While the invention has been particularly shown and described with reference to preferred embodiments thereof, it will be understood by those skilled in the art that the above and other changes in form and details may be made therein without departing from the spirit and scope of the invention.

What is claimed is:

1. In a process of manufacturing a multilayer printed circuit board, the steps of:

manufacturing a plurality of circuit board layers, each comprising a layer of insulating material having a circuit configuration of electrically conductive material on the surface thereof;

making, in at least one of said circuit board layers, at least one via hole at a site through which it is intended that a through hole shall pass;

said via hole being made larger in cross-sectional area than said through hole and being located in such a manner that it occupies substantially all of the area that will be occupied by said through hole on said one of said circuit board layers;

placing electrically conductive material within said via hole;

making a through hole in said printed circuit board, said through hole passing through said one of said circuit board layers;

said through hole being made in such a location that, when it passes through said one of said circuit board layers, its cross-sectional area is substantially contained within the cross-sectional area of said via hole; and electrically insulating the electrically conductive material within said via hole from said through hole.

2. In a process of manufacturing a multilayer printed circuit board, the steps of:

manufacturing a plurality of circuit board layers, each comprising a layer of insulating material having a circuit configuration of electrically conductive material on the surface thereof;

making, in at least one of said circuit board layers, at least one via hole at a site through which it is intended that a first through hole shall pass;

said via hole being made larger in cross-sectional area than said first through hole and being located in such a manner that it occupies substantially all of the area that will be occupied by said first through hole on said one of said circuit board layers;

placing electrically conductive material within said via hole;

substantially filling the remainder of said via hole with insulating material;

making a first through hole in said printed circuit board, said first through hole passing through said one of said circuit board layers;

said first through hole being made in such a location that, when it passes through said one of said circuit board layers, it passes through the insulating material that substantially fills said via hole.

3. The process of manufacturing a multilayer printed circuit board of claim 2 further including:

laminating said circuit board layers together by stacking said layers with a bonding agent separating each layer from its next adjacent layer, and applying appropriate heat and pressure to cause lamination;

said step of substantially filling said via hole being accomplished during said lamination step by extruding said bonding agent into said via hole.

4. The process of manufacturing a multilayer printed circuit board of claim 2 additionally including the steps of:

placing electrically conductive material within said first through hole;

substantially filling the remainder of said first through hole with insulating material; and making a second through hole in said printed circuit board, said second through hole extending through a plurality of layers of said printed circuit board including all of the layers of said printed circuit board that contain said first through hole, said second through hole passing through the insulating material that substantially fills said first through hole.

* * * * *